(12) United States Patent
Liao

(10) Patent No.: US 10,505,133 B2
(45) Date of Patent: Dec. 10, 2019

(54) ORGANIC LIGHT EMITTING DEVICE AND MANUFACTURING METHOD THEREOF

(71) Applicant: BOE TECHNOLOGY GROUP CO., LTD., Beijing (CN)

(72) Inventor: Chinlung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 15/552,601

(22) PCT Filed: Jan. 5, 2017

(86) PCT No.: PCT/CN2017/070201
§ 371 (c)(1),
(2) Date: Aug. 22, 2017

(87) PCT Pub. No.: WO2017/181738
PCT Pub. Date: Oct. 26, 2017

(65) Prior Publication Data
US 2018/0190926 A1    Jul. 5, 2018

(30) Foreign Application Priority Data
Apr. 20, 2016  (CN) .......................... 2016 1 0246731

(51) Int. Cl.
*H01L 51/00* (2006.01)
*H01L 51/50* (2006.01)
(Continued)

(52) U.S. Cl.
CPC ........ *H01L 51/5024* (2013.01); *H01L 51/506* (2013.01); *H01L 51/5036* (2013.01); *H01L 51/5203* (2013.01); *H01L 51/56* (2013.01)

(58) Field of Classification Search
None
See application file for complete search history.

(56) References Cited

U.S. PATENT DOCUMENTS 7,807,992 B2 * 10/2010 Wang .................. H01L 51/5012
257/40
8,153,275 B2 * 4/2012 Hannada ................ C09K 11/06
252/301.16
(Continued)

FOREIGN PATENT DOCUMENTS

CN         1535483 A       10/2004
CN         1601780 A        3/2005
(Continued)

OTHER PUBLICATIONS

Search Report for International Application No. PCT/CN2017/070201 dated Apr. 11, 2017.
(Continued)

*Primary Examiner* — Robert S Loewe
(74) *Attorney, Agent, or Firm* — Calfee, Halter & Griswold LLP

(57) ABSTRACT

An organic light emitting device with a double-doped system, which in particular emits blue light, as well as a method for manufacturing such an organic light emitting device are disclosed. The organic light emitting device includes a substrate; a first electrode on the substrate; a second electrode opposite to the first electrode; and an organic light emitting layer between the first electrode and the second electrode. The organic light emitting layer includes a first dopant and a second dopant. With an organic light emitting layer including a first dopant and a second dopant, this disclosure achieves an organic light emitting device with a double-doped system, wherein different dopants emitting light of different colors are mixed into a same light emitting layer. This further improves a service life and light emitting efficiency of the light emitting device.

18 Claims, 2 Drawing Sheets

100

| 103 |
|---|
| EML2  102' |
| EML1  102 |
| 101 |

(51) Int. Cl.
*H01L 51/56* (2006.01)
*H01L 51/52* (2006.01)

(56) References Cited

U.S. PATENT DOCUMENTS

| | | | | |
|---|---|---|---|---|
| 8,330,153 | B2* | 12/2012 | Ooishi | H01L 51/5016 257/40 |
| 8,546,844 | B2* | 10/2013 | Smith | H01L 51/5036 257/102 |
| 9,082,994 | B2* | 7/2015 | Watabe | H01L 51/5012 |
| 2002/0146589 | A1* | 10/2002 | Akiyama | H01L 51/5012 428/690 |
| 2004/0066139 | A1* | 4/2004 | Hamada | H05B 33/145 313/506 |
| 2004/0155238 | A1 | 8/2004 | Thompson et al. | |
| 2005/0048311 | A1* | 3/2005 | Hatwar | H01L 51/5048 428/690 |
| 2005/0095454 | A1* | 5/2005 | Ko | C07C 13/62 428/690 |
| 2005/0100760 | A1* | 5/2005 | Yokoyama | H01L 51/5036 428/690 |
| 2005/0194892 | A1* | 9/2005 | Lu | H01L 51/5016 313/504 |
| 2005/0218768 | A1* | 10/2005 | Saito | H01L 27/3213 313/112 |
| 2006/0029828 | A1* | 2/2006 | Kanno | H01L 51/5096 428/690 |
| 2006/0051497 | A1* | 3/2006 | Hamada | C09K 11/06 427/66 |
| 2006/0063032 | A1 | 3/2006 | Matsusue | |
| 2006/0066225 | A1* | 3/2006 | Kishino | C09K 11/06 313/504 |
| 2006/0158104 | A1 | 7/2006 | Iijima et al. | |
| 2006/0289882 | A1* | 12/2006 | Nishimura | C09K 11/06 257/94 |
| 2007/0009761 | A1* | 1/2007 | Goto | C08G 61/02 428/690 |
| 2007/0194303 | A1* | 8/2007 | Harada | H01L 51/5237 257/40 |
| 2008/0013047 | A1 | 1/2008 | Todd et al. | |
| 2008/0093989 | A1 | 4/2008 | Spindler et al. | |
| 2008/0258613 | A1* | 10/2008 | Fukuoka | H01L 51/5012 313/504 |
| 2009/0062141 | A1 | 3/2009 | Reppy et al. | |
| 2011/0062425 | A1* | 3/2011 | Kishino | H01L 51/5016 257/40 |
| 2011/0266525 | A1* | 11/2011 | Lecloux | C09K 11/06 257/40 |
| 2012/0013246 | A1 | 1/2012 | Kwak et al. | |
| 2014/0220721 | A1* | 8/2014 | Kobayashi | H01L 51/504 438/46 |
| 2015/0188073 | A1* | 7/2015 | Ahn | H01L 27/3209 257/40 |
| 2015/0349286 | A1* | 12/2015 | Forrest | C09K 11/06 252/301.16 |
| 2016/0043324 | A1* | 2/2016 | Qiu | H01L 51/0058 257/40 |
| 2016/0111659 | A1* | 4/2016 | Yang | C07D 487/06 257/40 |

FOREIGN PATENT DOCUMENTS

| | | |
|---|---|---|
| CN | 1678150 A | 10/2005 |
| CN | 1790768 A | 6/2006 |
| CN | 2935479 Y | 8/2007 |
| CN | 101179116 A | 5/2008 |
| CN | 101212026 A | 7/2008 |
| CN | 102432844 A | 5/2012 |
| CN | 104078578 A | 10/2014 |
| CN | 105679957 A | 6/2016 |
| WO | 2008005848 A | 1/2008 |

OTHER PUBLICATIONS

First Office Action for Chinese Patent Application No. 201610246731.3 dated Mar. 14, 2017.
Second Office Action for Chinese Patent Application No. 201610246731.3 dated Aug. 2, 2017.

* cited by examiner

400

| S401 |
| --- |
| S402 |
| S403 |
| S404 |

Fig. 4

ORGANIC LIGHT EMITTING DEVICE AND MANUFACTURING METHOD THEREOF

The present application is the U.S. national phase entry of PCT/CN2017/070201, with an international filling date of Jan. 5, 2017, which claims the benefit of Chinese patent application No. 201610246731.3 filed on Apr. 20, 2016, the entire disclosures of which are incorporated herein by reference.

FIELD

This disclosure relates to the field of organic light emitting device, and specifically to an organic light emitting device with a double-doped system, which in particular emits blue light, as well as a method for manufacturing such an organic light emitting device.

BACKGROUND ART

Organic light emitting devices (OLEDs) have attracted much attention at present in virtue of their advantages such as wide view angle, high contrast and fast response time. Moreover, OLEDs can operate at a low voltage and achieve multi-color images. Therefore, a lot of research on OLEDs has been carried out.

A basic structure for a monochrome OLED comprises an anode, a cathode, and a light emitting layer arranged between the anode and the cathode. When a current is applied to the anode and the cathode on respective sides of the light emitting layer, electrons and holes will be recombined in the light emitting layer, thereby emitting light. Generally, by doping a host material of the light emitting layer with different dopants (hereinafter also referred to as guest materials) emitting light of different colors, an OLED emitting light of different colors can be produced.

In most existing approaches, OLEDs emitting blue light use a single-doped system. In other words, the organic light emitting layer comprises only one guest material emitting blue light. However, such a blue light OLED has many problems such as short service life and low light emitting efficiency.

SUMMARY

In light of the above discussion, it is an objective of this disclosure to provide an organic light emitting device with a double-doped system which in particular emits blue light, thereby effectively solving or alleviating one or more of the above defects, and improving a light emitting efficiency and service life of the blue light device.

According to an aspect of this disclosure, an organic light emitting device is provided. The organic light emitting device comprises: a substrate; a first electrode on the substrate; a second electrode opposite to the first electrode; and an organic light emitting layer between the first electrode and the second electrode. The organic light emitting layer comprises a first dopant and a second dopant. With an organic light emitting layer comprising a first dopant and a second dopant, this disclosure achieves an organic light emitting device with a double-doped system, wherein different dopants emitting light of different colors are mixed into a same light emitting layer. This further improves a service life and light emitting efficiency of the light emitting device.

According to an exemplary embodiment of this disclosure, the first dopant and the second dopant are both blue light dopants. Specifically, the first dopant comprises one of and the second dopant comprises another of the following materials: 2,5,8,11-tetra-tert-butylperylene; 4,4'-bis(9-ethyl-3-carbazovinylene)-1,1'-biphenyl (BCzVBi); 4,4'-bis[4-(di-p-tolylamino)styryl]biphenyl (DPAVBI); 4-(di-p-tolylamino)-4'-[(di-p-tolylamino) styryl]stilbene (DPAVB); 3,3'-(1,4-phenylene di-2,1-ethenediyl)bis(9-ethyl-9H-carbazole); bis[2-(2-pyridinyl)phenolato]beryllium $(BE(PP)_2)$; and diphenylamine-di(styryl)aromatic. Thereby, this disclosure provides a novel organic light emitting device emitting blue light and having a double-doped system, instead of a single-doped system common in any existing approaches. Besides, with the above specific light emitting materials, blue light emission is generally achieved in an organic light emitting layer having a double-doped system, thereby eliminating or at least alleviating problems associated with a single-doped system emitting blue light, such as low light emitting efficiency and short service life as mentioned above.

According to an exemplary embodiment of this disclosure, the organic light emitting layer further comprises a host material. Specifically, the host material comprises: 3-tert-butyl-9,10-di(2-naphthalen)anthracene; 9,10-di-2-naphthalen anthracene; 4,4'-di(9-carbazole)biphenyl; 3,3'-di(N-carbazole)-1,1'-biphenyl; di-aryl-anthracene derivatives; di-styrene-aromatic derivatives; pyrene derivatives; spiral ring-bis-fluorenyl derivatives; or 2-methyl-9,10-bis(naphthalen-2-yl)anthracene. By adding a host material, a host-guest system is established in the organic light emitting layer. This helps to avoid problems such as concentration quenching of the light emitting materials (i.e., guest materials such as the first dopant or the second dopant).

According to an exemplary embodiment of this disclosure, in the organic light emitting layer, weight percentages of the first dopant and the second dopant range from 0.1% to 7% and from 0.4% to 20% respectively, with the rest being the host material. Specifically, weight percentages of the first dopant, the second dopant and the host material in the organic light emitting layer are 0.5%: 4.5%: 95%. As compared with a blue light device having a single-doped system under the same condition, by means of the above weight percentages in the embodiment of this disclosure, the organic light emitting device having a double-doped system achieves notably improved performance.

According to an exemplary embodiment of this disclosure, the organic light emitting layer has a thickness of 15~45 nm. Such a thickness can be selected upon specific application needs of the light emitting device, such as requirements for the thickness and requirements for the light emitting performance.

According to an exemplary embodiment of this disclosure, the organic light emitting layer further comprises a hole injection layer and/or a hole transport layer between the first electrode and the organic light emitting layer. Specifically, the hole injection layer comprises one of the following materials: poly(3,4-ethylenedioxythiophene)-polystyrene sulfonic acid (PEDOT/PSS); polythiophene; polyaniline; and polypyrrole molecules. Correspondingly, the hole transport layer comprises one of the following materials: polythiophene; polyaniline; polytriphenylamine; and polypyrrole molecules. Furthermore, the hole injection layer and the hole transport layer both have a thickness of 10~110 nm. As can be easily understood by those skilled in the art, using the hole injection layer and/or hole transport layer, effective injection and migration of holes into the organic light emitting layer are enabled. Moreover, a surface of the anode is more planarized to prevent short circuits.

According to an exemplary embodiment of this disclosure, the organic light emitting device further comprises an electron transport layer and/or an electron buffer layer between the second electrode and the organic light emitting layer. Specifically, the electron transport layer comprises one of the following materials: (4,7-diphenyl-1,10-phenanthroline); 2,9-bis(naphthalene-2-radical)-4,7-diphenyl-1,10-phenanthroline; 4,7-diphenyl-1,10-phenanthroline; 2,9-dimethyl-4,7-biphenyl-1,10-phenanthroline; and 8-hydroxyquinoline aluminum. Correspondingly, the electron buffer layer comprises one of the following materials: LiF; and 8-quinolinolato lithium (LiQ). Furthermore, the electron transport layer has a thickness of 10~35 nm, and the buffer layer has a thickness of 1~5 nm. In a similar way, by means of the electron transport layer and/or the electron buffer layer, mobility of electrons in the organic light emitting device is promoted. Thus, a light emitting efficiency of the device is improved.

According to an exemplary embodiment of this disclosure, the substrate is a glass substrate, and the first electrode is an indium tin oxide film deposited on the glass substrate. Specifically, the indium tin oxide film has a thickness of 50~135 nm. Obviously, as can be easily understood by those skilled in the art, the indium tin oxide film can be replaced by other transparent conductive material layers having similar characteristics. Likewise, the thicknesses listed above are only used for illustrating the principle of this disclosure, instead of limiting the scope thereof.

According to an embodiment of this disclosure, the second electrode is made of aluminum and has a thickness of 80~200 nm. Obviously, those skilled in the art can make selections, based on specific application conditions, of any other suitable electrode materials, such as lithium, sodium, potassium, cesium, magnesium, calcium, barium, silver, and an alloy comprising any one or more of these metal elements.

According to another aspect of this disclosure, a method for manufacturing an organic light emitting device is provided. The method comprises steps as follows: providing a substrate; providing a first electrode on the substrate; providing an organic light emitting layer on the first electrode; and providing a second electrode on the organic light emitting layer, wherein the organic light emitting layer comprises a first dopant and a second dopant.

In an exemplary embodiment, the first dopant and the second dopant are both blue light dopants. Specifically, the first dopant comprises one of and the second dopant comprises another of the following materials: 2,5,8,11-tetra-tert-butylperylene; 4,4'-bis(9-ethyl-3-carbazovinylene)-1,1'-biphenyl (BCzVBi); 4,4'-bis[4-(di-p-tolylamino)styryl] biphenyl (DPAVBI); 4-(di-p-tolylamino)-4'-[(di-p-tolylamino) styryl]stilbene (DPAVB); 3,3'-(1,4-phenylene di-2,1-ethenediyl)bis(9-ethyl-9H-carbazole); bis[2-(2-pyridinyl)phenolato]beryllium (BE(PP)$_2$); and diphenylamine-di(styryl)aromatic.

In another specific embodiment, the organic light emitting layer further comprises a host material. Specifically, the host material comprises: 3-tert-butyl-9,10-di(2-naphthalen)anthracene; 9,10-di-2-naphthalen anthracene; 4,4'-di(9-carbazole)biphenyl; 3,3'-di(N-carbazole)-1,1'-biphenyl; di-aryl-anthracene derivatives; di-styrene-aromatic derivatives; pyrene derivatives; spiral ring-bis-fluorenyl derivatives; or 2-methyl-9,10-bis(naphthalen-2-yl)anthracene.

According to some other specific embodiments, in the organic light emitting layer, weight percentages of the first dopant and the second dopant range from 0.1% to 7% and from 0.4% to 20% respectively, with the rest being the host material. Specifically, weight percentages of the first dopant, the second dopant and the host material in the organic light emitting layer are 0.5%: 4.5%: 95%.

BRIEF DESCRIPTION OF DRAWINGS

The above and other features and advantages of this disclosure will become apparent from the following specific embodiments described with reference to the drawings, and will be described below in detail with reference to the specific embodiments. In the drawings:

FIG. 4 shows a flow diagram of a method for manufacturing an organic light emitting device according to an embodiment of this disclosure.

DETAILED DESCRIPTION OF EMBODIMENTS

Figure 1:
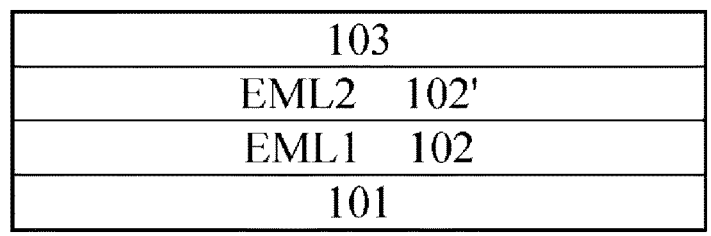
FIG. 1 shows a schematic structure view for a typical organic light emitting device emitting blue light.

Although there have been reports about an organic light emitting device comprising two blue dopants (which emit blue light), one of the dopants is mixed into a first blue light emitting layer, and the other is mixed into a second blue light emitting layer different from the first blue light emitting layer. Therefore, such a blue light organic light emitting device substantially comprises two different single-doped systems without forming a double-doped system. FIG. 1 shows an example 100 for such an organic light emitting device, which comprises a first electrode 101 made of ITO, a second electrode 103 made of Al, a first light emitting layer EML1 102 and a second light emitting layer EML2 102' doped with a first blue dopant and a second blue dopant respectively.

Unlike the above single-doped systems, an organic light emitting device comprising a double-doped system according to an embodiment of this disclosure will be described below in detail with reference to the drawings.

Figure 2:
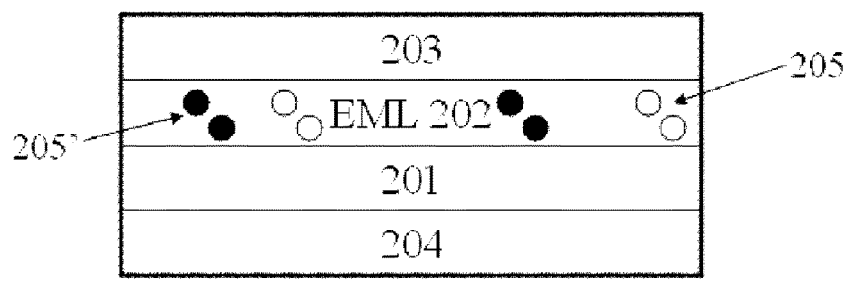
FIG. 2 shows a schematic structure view for an organic light emitting device according to an embodiment of this disclosure.

The organic light emitting device 200 according to an embodiment of this disclosure comprises: a substrate 204; a first electrode 201 on the substrate 204; a second electrode 203 opposite to the first electrode 201; and an organic light emitting layer EML 202 between the first electrode 201 and the second electrode 203. The organic light emitting layer EML 202 comprises a first dopant 205 (indicated by a hollow circle in FIG. 2) and a second dopant 205' (indicated by a solid circle in FIG. 2). By means of an organic light emitting layer EML 202 comprising a first dopant 205 and a second dopant 205', this disclosure achieves an organic light emitting device 202 with a double-doped system, wherein different dopants (i.e., the first dopant 205 and the second dopant 205') emitting light of different colors are mixed into a same light emitting layer EML 202 at the same time. This further improves a service life and light emitting efficiency of the light emitting device, and so on.

According to an exemplary embodiment, the first dopant 205 and the second dopant 205' are both blue light dopants. Specifically, the first dopant 205 comprises one of and the second dopant 205' comprises another of the following materials: 2,5,8,11-tetra-tert-butylperylene; 4,4-bis(9-ethyl-3-carbazovinylene)-1,1'-biphenyl (BCzVBi); 4,4'-bis[4-(di-p-tolylamino)styryl]biphenyl (DPAVBI); 4-(di-p-tolylamino)-4'-[(di-p-tolylamino) styryl]stilbene (DPAVB); 3,3'-(1,4-phenylene di-2,1-ethenediyl)bis(9-ethyl-9H-carbazole); bis[2-(2-pyridinyl)phenolato]beryllium (BE(PP)$_2$); and diphenylamine-di(styryl)aromatic. Apparently, as can be easily understood by those skilled in the art, the specific materials listed above for the first dopant 205 and the second dopant 205' are only illustrative and exemplary, rather than exhaustive for all possible choices.

According to an exemplary embodiment, the organic light emitting layer EML 202 further comprises a host material. Specifically, the host material comprises: 3-tert-butyl-9,10-di(2-naphthalen)anthracene; 9,10-di-2-naphthalen anthracene; 4,4'-di(9-carbazole)biphenyl; 3,3'-di(N-carbazole)-1,1'-biphenyl; di-aryl-anthracene derivatives; di-styrene-aromatic derivatives; pyrene derivatives; spiral ring-bis-fluorenyl derivatives; or 2-methyl-9,10-bis(naphthalen-2-yl) anthracene. By adding a host material in the organic light emitting layer, a host-guest system is established. This helps to avoid problems such as concentration quenching of the light emitting materials.

According to an exemplary embodiment, in the organic light emitting layer, weight percentages of the first dopant and the second dopant range from 0.1% to 7% and from 0.4% to 20% respectively, with the rest being the host material. Specifically, weight percentages of the first dopant 205, the second dopant 205' and the host material in the organic light emitting layer EML202 are 0.5%: 4.5%: 95%. Apparently, having benefits from teaching of this disclosure, those skilled in the art can select optimal weight percentages through experiments based on specific applications, so as to improve performances of the light emitting device.

According to another specific embodiment, the organic light emitting layer EML 202 has a thickness of 15~45 nm. Such a thickness can be selected upon specific application needs of the light emitting device, such as requirements for the thickness and requirements for the light emitting performance.

Figure 3:
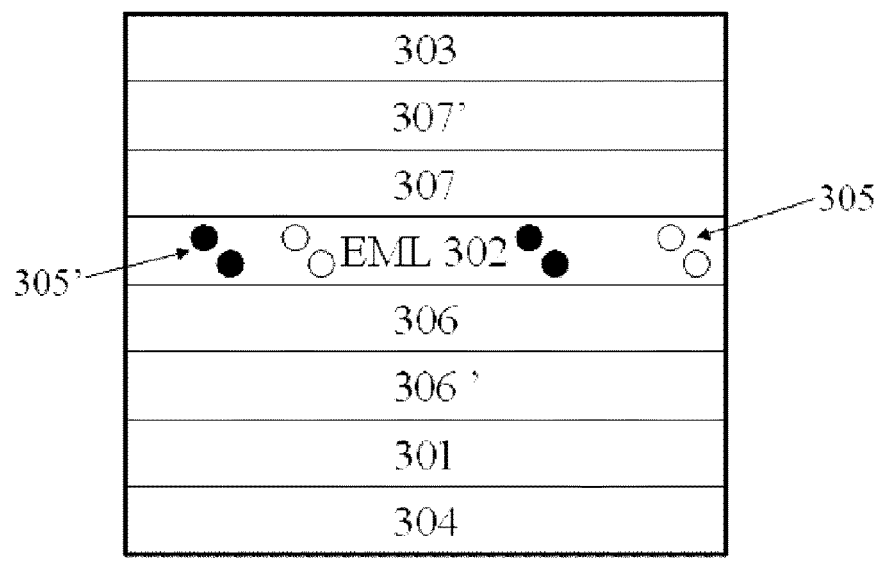
FIG. 3 shows a schematic structure view for an organic light emitting device according to another embodiment of this disclosure.

Referring to FIG. 3, an organic light emitting device according to another embodiment of this disclosure will be described in the following. Specifically, an organic light emitting device 300 in FIG. 3 comprises a first electrode 301, an organic light emitting layer 302, a second electrode 303, a substrate 304, a first dopant 305 and a second dopant 305'. All of them are similar to the first electrode 201, the organic light emitting layer 202, the second electrode 203, the substrate 204, the first dopant 205 and the second dopant 205' shown in FIG. 2, and hence will not be described herein repeatedly.

According to an exemplary embodiment, in FIG. 3, the organic light emitting device 300 further comprises a hole injection layer 306 and a hole transport layer 306' between the first electrode 301 and the organic light emitting layer EML 302. Specifically, the hole injection layer 306 comprises one of the following materials: poly(3,4-ethylenedi-oxythiophene)-polystyrene sulfonic acid (PEDOT/PSS); polythiophene; polyaniline; and polypyrrole molecules. Correspondingly, the hole transport layer 306' comprises one of the following materials: polythiophene; polyaniline; polytriphenylamine; and polypyrrole molecules. Furthermore, the hole injection layer 306 and the hole transport layer 306' both have a thickness of 10~110 nm. Apparently, having benefits from teaching of this disclosure, those skilled in the art can select any suitable materials based on specific applications to manufacture the hole injection layer 306 and the hole transport layer 306', and further determine their thicknesses.

According to an exemplary embodiment, the organic light emitting device 300 further comprises an electron transport layer 307 and an electron buffer layer 307' between the second electrode 303 and the organic light emitting layer EML 302. Specifically, the electron transport layer 307 comprises one of the following materials: (4,7-diphenyl-1,10-phenanthroline); 2,9-bis(naphthalene-2-radical)-4,7-di-phenyl-1,10-phenanthroline; 4,7-diphenyl-1,10-phenanthroline; 2,9-dimethyl-4,7-biphenyl-1,10-phenanthroline; and 8-hydroxyquinoline aluminum. Correspondingly, the electron buffer layer 307' comprises one of the following materials: LiF; and 8-quinolinolato lithium (LiQ). Apparently, having benefits from teaching of this disclosure, those skilled in the art can select any suitable materials based on specific applications to manufacture the electron transport layer 307 and the electron buffer layer 307', and further determine their thicknesses.

According to a further specific embodiment, the substrate 304 is a glass substrate, and the first electrode 301 is an indium tin oxide (ITO) film deposited on the glass substrate 304. Furthermore, the second electrode 303 is made of aluminum and has a thickness of 80~200 nm. In a similar way, those skilled in the art can make selections, depending on conditions of specific applications, of any other suitable substrate materials and electrode materials, as well as their thicknesses suitable for specific applications.

Figure 4:
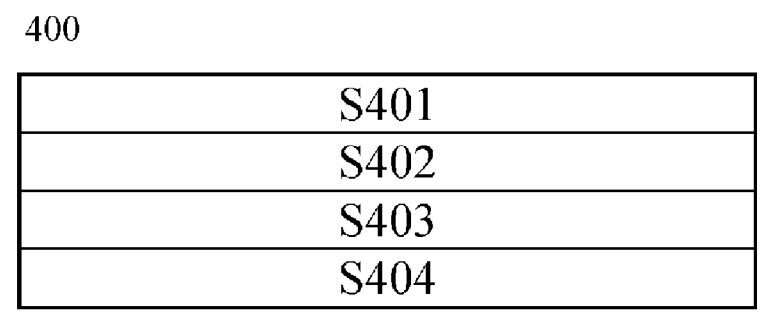

Next, a method 400 for manufacturing an organic light emitting device according to an embodiment of this disclosure will be described with reference to FIG. 4. The method 400 comprises steps as follows: S401, providing a substrate; S402, providing a first electrode on the substrate; S403, providing an organic light emitting layer on the first electrode; and S404, providing a second electrode on the organic light emitting layer, wherein the organic light emitting layer comprises a first dopant and a second dopant. As can be easily anticipated by those skilled in the art, the above steps for providing various layers can be implemented by using techniques or measures commonly known in the art, including but not limited to: chemical vapor deposition, plasma deposition, sputtering, vapor plating, spin coating, spraying and so on. Apparently, the techniques or measures listed above are only representative examples. Those skilled in the art can select suitable techniques or measures based on specific applications to provide the substrate, the first electrode, the second electrode and the organic light emitting layer.

When the substrate is a glass substrate and the first electrode is an ITO film deposited on the glass substrate, the method for manufacturing an organic light emitting device can be specifically executed in the following way. Firstly, the glass substrate comprising ITO (with a surface resistance <30Ω/□) is treated by a photolithography process to form an ITO electrode pattern. After that, the glass substrate comprising ITO is washed sequentially in ultrasonic environments such as deionized water, acetone and absolute ethanol, and then dried by N$_2$ and subjected to O$_2$ plasma treatment. This is equivalent to the two steps of providing a substrate and providing a first electrode on the substrate. After such treatment, the substrate having an ITO pattern is placed on a spin coater. Then, a hole injection layer (the material is selected as above with a thickness of 10~110 nm) and a hole transport layer (the material is selected as above with a thickness of 10~110 nm) are spin-coated and dried sequentially. After that, the obtained structure is placed in a vapor plating chamber, and in case of a vacuum degree below 5*10$^{-4}$ Pa, sequentially depositing by vacuum thermal evaporation on the hole transport layer an organic light emitting layer (comprising 0.5%: 4.5%: 95% by weight of a first dopant, a second dopant and a host material, wherein each material is selected as above), an electron transport layer (the material is selected as above with a thickness of 10~35 nm), an electron buffer layer (the material is selected as above with a thickness of 1~5 nm) and a second electrode layer (which is made of Al and has a thickness of 80~200 nm). Obviously, as can be easily understood by those skilled in the art, prior to the deposition of an organic light emitting layer, an interface modification layer can also be deposited on the hole transport layer. The interface modification layer can be specifically formed by N,N'-di-[(1-naphthalenyl)-N, N'-diphenyl]-1,1'-biphenyl)-4,4'-diamine, N,N'-bis(3-methylphenyl)-N,N'-diphenyl-benzidine, 4,4'-cyclohexylidenebis[N,N-bis(4-methylphenyl)aniline], 2,2',7,7'-tetrakis(N, N-diphenylamino)-9,9-spirobifluorene, N,N'-bis(3-methylphenyl)-N,N'-diphenyl-benzidine, wherein the thickness can be selected as 1~5 nm. During the above vapor plating, all the other layers use open mask plates with an evaporation rate of 0.1~5 nm/s, except for the second electrode Al which requires using a metal cathode mask plate with an evaporation rate of 0.5 nm/s, wherein a light emitting area of the device is 2 mm*2 mm.

In order to prove validity of this disclosure, an organic light emitting device in which the organic light emitting layer comprises 5%: 95% (by weight) of a first dopant and a host material (i.e., a single-doped system), is also manufactured, and materials and thicknesses of the other functional layers are the same as in the case of the above device.

Starting from the above experiment process, table 1 below shows a contrast between experimental results of a single-doped system and a double-doped system. In this case, the two systems differ merely in that the organic light emitting layer in the single-doped system comprises 5%: 95% (by weight) of a first dopant and a host material, while the organic light emitting layer in the double-doped system comprises 0.5%: 4.5%: 95% (by weight) of a first dopant, a second dopant and a host material. Besides, T95 in table 1 indicates the time it takes for the brightness to attenuate to 95% of an initial value.

TABLE 1

| Device | Voltage applied (V) | Light emitting efficiency (Cd/A) | Quantum efficiency (%) | T95 (hr) |
|---|---|---|---|---|
| Single-doped system | 3.2 | 7.3 | 6.8 | 200 |
| Double-doped system | 3.5 | 8.2 | 7.8 | 250 |

As can be seen clearly from table 1 above, in case the other functional layers are the same, the double-doped blue light emitting organic device achieves performance which is notably improved, wherein the light emitting efficiency, the service life are all improved to a certain degree.

It should be understood that in the description of this disclosure, directional or positional relations indicated by terms such as "center", "up", "down", "front", "back", "left", "right", "vertical", "horizontal", "top", "bottom", "interior" and "exterior" are all directional or positional relations shown on the basis of drawings. They are used only for describing contents of this disclosure and simplifying description, instead of indicating or implying that the indicated devices or elements must be orientated particularly, or constructed and operated in a particular orientation. Therefore, they cannot be construed as limiting this disclosure.

Terms such as "first" and "second" are used for descriptive purposes and should not be construed as indicating or implying relative importance or hinting numbers of the indicated technical feature. Therefore, features defined by terms such as "first" and "second" can indicate explicitly or implicitly that one or more such features are comprised. In the description of this disclosure, unless explained otherwise, "multiple" means two or more.

It should be noted that in the description of this disclosure, unless explicitly prescribed and defined otherwise, terms such as "mount", "connect" and "link" should be understood in a broad sense. For example, the connection can be fixed connection, detachable connection or integral connection. Alternatively, it can be direct connection, indirect connection via an intermediate medium, or connection inside two elements. For one having ordinary skills in the art, specific meanings of the above terms in this disclosure can be understood based on specific situations.

In the description, specific features, structures, materials or characteristics can be combined in any suitable manner according to any one or more embodiments or examples.

What described above are only specific embodiments of this disclosure, but the protection scope of this disclosure is not limited thereto. Any variation or substitution easily conceivable for a skilled person familiar with the art within the technical scope of this disclosure shall fall within the protection scope of this disclosure. Therefore, the protection scope of this disclosure should be subject to the protection scope of the claims below.

The invention claimed is:

1. An organic light emitting device, comprising:
a substrate;
a first electrode on the substrate;
a second electrode opposite to the first electrode; and
an organic light emitting layer between the first electrode and the second electrode,
wherein the organic light emitting layer comprises a first dopant and a second dopant,
wherein the first dopant and the second dopant are both blue light dopants, and
wherein the first dopant comprises one of and the second dopant comprises another of materials selected from the group consisting of: 4,4'-bis[4-(di-p-tolylamino) styryl]biphenyl (DPAVBI); 4-(di-p-tolylamino)-4'-[(di-p-tolylamino)styryl]stilbene (DPAVB); 3,3'-(1,4-phenylene di-2,1-ethenediyl)bis(9-ethyl-9H-carbazole); and bis[2-(2-pyridinyl)phenolato]beryllium $(BE(PP)_2)$.

2. The organic light emitting device according to claim 1, wherein the organic light emitting layer further comprises a host material.

3. The organic light emitting device according to claim 2, wherein the host material comprises: 3-tert-butyl-9,10-di(2-naphthalen)anthracene; 9,10-di-2-naphthalen anthracene; 4,4'-di(9-carbazole)biphenyl; 3,3'-di(N-carbazole)-1,1'-biphenyl; di-aryl-anthracene derivatives; di-styrene-aromatic derivatives; pyrene derivatives; spiral ring-bis-fluorenyl derivatives; or 2-methyl-9,10-bis(naphthalen-2-yl)anthracene.

4. The organic light emitting device according to claim 3, wherein in the organic light emitting layer, weight percentages of the first dopant and the second dopant range from 0.1% to 7% and from 0.4% to 20% respectively, with the rest being the host material.

5. The organic light emitting device according to claim 4, wherein weight percentages of the first dopant, the second dopant and the host material in the organic light emitting layer are 0.5%: 4.5%: 95%.

6. The organic light emitting device according to claim 1, wherein the organic light emitting layer has a thickness of 15 to 45 nm.

7. The organic light emitting device according to claim 1, further comprising at least one of a hole injection layer and a hole transport layer between the first electrode and the organic light emitting layer.

8. The organic light emitting device according to claim 7, wherein the hole injection layer comprises one of materials selected from the group consisting of: poly(3,4-ethylenedioxythiophene)-polystyrene sulfonic acid (PEDOT/PSS); polythiophene; polyaniline; and polypyrrole molecules.

9. The organic light emitting device according to claim 7, wherein the hole transport layer comprises one of materials selected from the group consisting of: polythiophene; polyaniline; polytriphenylamine; and polypyrrole molecules.

10. The organic light emitting device according to claim 7, wherein the hole injection layer and the hole transport layer both have a thickness of 10~110 nm.

11. The organic light emitting device according to claim 1, further comprising at least one of an electron transport layer and an electron buffer layer between the second electrode and the organic light emitting layer.

12. The organic light emitting device according to claim 11, wherein the electron transport layer comprises one of materials selected from the group consisting of: (4,7-diphenyl-1,10-phenanthroline); 2,9-bis(naphthalene-2-radical)-4,7-diphenyl-1,10-phenanthroline; 4,7-diphenyl-1,10-phenanthroline; 2,9-dimethyl-4,7-biphenyl-1,10-phenanthroline; and 8-hydroxyquinoline aluminum.

13. The organic light emitting device according to claim 11, wherein the electron buffer layer comprises one of materials selected from the group consisting of: LiF; and 8-quinolinolato lithium.

14. The organic light emitting device according to claim 11, wherein the electron transport layer has a thickness of 10~35 nm, and the buffer layer has a thickness of 1~5 nm.

15. The organic light emitting device according to claim 1, wherein the substrate is a glass substrate and the first electrode is an indium tin oxide film deposited on the glass substrate.

16. The organic light emitting device according to claim 15, wherein the indium tin oxide film has a thickness of 50~135 nm.

17. The organic light emitting device according to claim 1, wherein the second electrode is made of aluminum and has a thickness of 80~200 nm.

18. A method for manufacturing an organic light emitting device, comprising steps of:
    providing a substrate;
    providing a first electrode on the substrate;
    providing an organic light emitting layer on the first electrode; and
    providing a second electrode on the organic light emitting layer,
    wherein the organic light emitting layer comprises a first dopant and a second dopant,
    wherein the first dopant and the second dopant are both blue light dopants, and
    wherein the first dopant comprises one of and the second dopant comprises another of materials selected from the group consisting of: 4,4'-bis[4-(di-p-tolylamino)styryl]biphenyl (DPAVBI); 4-(di-p-tolylamino)-4'-[(di-p-tolylamino)styryl]stilbene (DPAVB); 3,3'-(1,4-phenylene di -2,1 -ethenediyl)bis(9-ethyl-9H-carbazole); and bis[2-(2-pyridinyl)phenolato]beryllium (BE(PP)$_2$).

* * * * *